July 28, 1959 LA VERNE E. MILLER 2,897,464

LINEAR TUNING CURVE INDUCTOR

Filed Jan. 9, 1957 2 Sheets-Sheet 1

Fig. I

INVENTOR.
LaVERNE E. MILLER
BY Woody and Harsha
ATTORNEYS

INVENTOR.
LaVerne E. Miller
BY Moody and Harsha
ATTORNEYS

United States Patent Office 2,897,464
Patented July 28, 1959

2,897,464

LINEAR TUNING CURVE INDUCTOR

La Verne E. Miller, Marion, Iowa, assignor to Collins Radio Company, Cedar Rapids, Iowa, a corporation of Iowa Application January 9, 1957, Serial No. 633,257

4 Claims. (Cl. 336—136)

This invention relates generally to permeability tuned oscillators and more specifically to improvements in the tuning mechanisms associated with such oscillators.

Permeability tuned oscillators are well known in the art, and one such oscillator is fully described and set forth in Patent 2,468,071, issued April 26, 1949, to T. A. Hunter. This patent is assigned to the assignee of this application. Permeability tuned oscillators, such as that described in the above noted patent, are individually calibrated so that linear frequency characteristics for dial rotation results. These oscillators, as presently manufactured, include all known stabilizing measures, such as sealed tank capacitors and hermetic sealing of the oscillator. Oscillators, such as that described in the above referenced patent, are adjusted by the internal mechanical corrector mechanism to produce the linear frequency characteristic. This results in an accurate output signal from the oscillator. However, the accuracy of the output signal of these oscillators may be improved by this invention.

This invention provides a correcting mechanism for changing the output frequency of the oscillator so that a linear output frequency characteristic results. This invention corrects minor variations in the output frequency which may result due to variations in the capacitance and inductance of the circuit in which the oscillator is installed, or from minor changes in the oscillator itself. This invention provides a novel means of making minor changes in the oscillator output frequency of a permeability tuned oscillator. This invention compensates for variations in output frequencies of a permeability tuned oscillator caused by different parameters of various installations. This invention provides a means of changing the tuning of a permeability tuned oscillator which is hermetically sealed without disturbing the seal.

It is an object of this invention to provide a hermetically sealed permeability tuned oscillator with exterior adjustments to compensate for minor variations in the calibrated output frequency of the oscillator so as to produce a linear frequency characteristic from said oscillator. It is a further object of this invention to provide for fine adjustments in the tuning characteristic curve of a permeability tuned oscillator without disturbing the hermetic seal of the oscillator which might render the oscillator susceptible to temperature and pressure variations of major proportions. It is a still further object of this invention to provide an exterior correction mechanism for making minor changes in the output frequency of a permeability tuned oscillator and to provide such exterior adjustments where the adjusting means itself is variable.

These and other objects of this invention will become apparent when the following description is read in conjunction with the drawings, in which.

Figure 1:
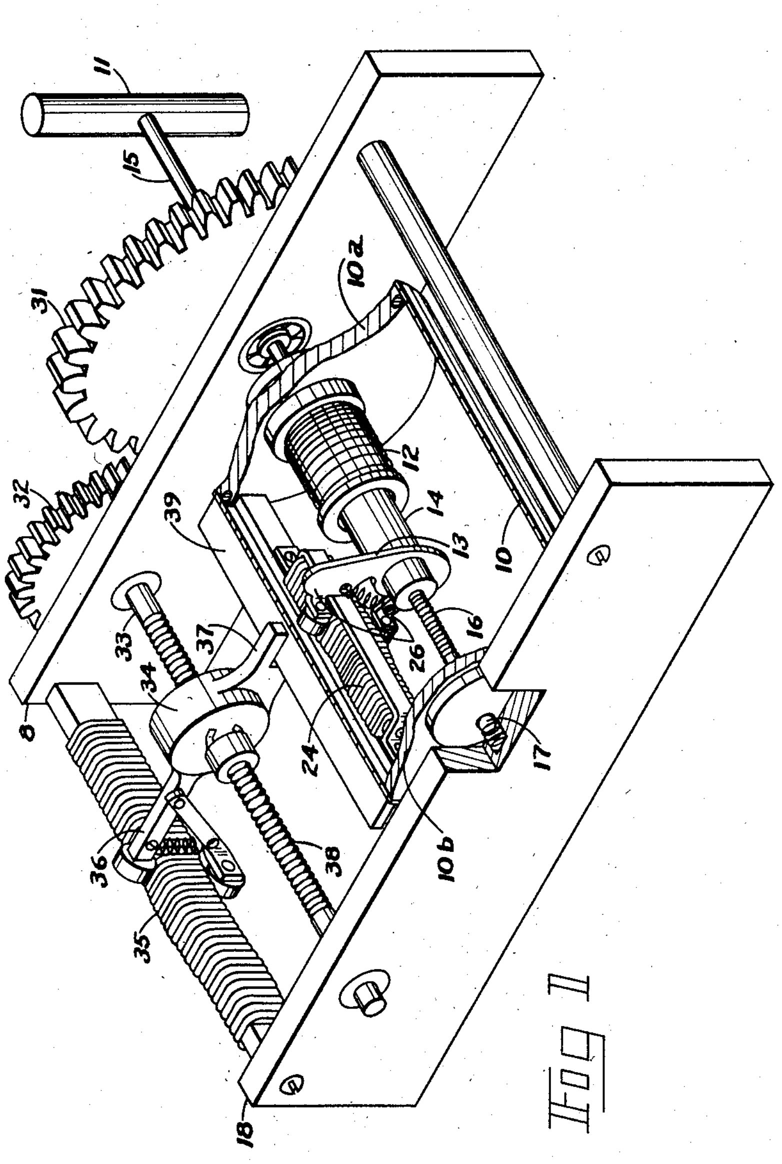
Figure 1 is a pictorial representation of one embodiment of this invention.

Referring now to Figure 1, the permeability tuned oscillator, which is not part of this invention per se, is depicted substantially the same as the oscillator in the above referenced patent. The oscillator is enclosed in a cylinder 10 having the ends closed with plates 10*a* and 10*b*. This cylinder is hermetically sealed in most oscillators. The cylindrical core member 14 is mounted so as to be axially and rotatably movable with respect to the coil 12. The follower 13 is provided to restrict the free rotation of the core member and yet to provide a limited and controlled rotational movement of the core member. The follower is mounted on the core member and has arms 26 which engage the irregular sides of the cam means 24. Cam 24 is rigidly fixed to the cylinder 10. The cam 24 is designed to compensate substantially for deviations from straight line tuning characteristics of the oscillator due to the axial movement of the core member 14 into the coil 12. The follower member is rotated on the shaft 16 under control of cam 24. This entire oscillator assembly operates substantially as described in the above referenced patent.

This invention provides the cylinder 10 as freely rotatable, being rotatably mounted by the spring and ball mechanism 17 into the frame member 18. The other end is supported in frame member 8 by shaft 16 so that cylinder 10 is rotated by shaft 16 if no restricting force is applied to the cylinder. A restrictive force is applied by this invention to control the rotation of the cylinder 10 in a predetermined manner. The tuning knob 11 is attached to the shaft 15 and rotates shaft 15. As shaft 15 is rotated, gears 31 and 32 are also rotated. Gear 32 is firmly affixed to, and rotates shaft 33. Shaft 33 has a threaded portion 38 thereon, where the threads are cut so that a follower 34 will progress axially along shaft 33 at a rate greater than the core member 14 progresses axially along shaft 16. In one embodiment of this invention which was caused to be constructed, the follower 34 on shaft 33 progressed three times as fast as the core member 14. The shaft 33 is supported by the frame members 8 and 18 and is freely rotatable. A follower member 34, having two arms 36 and 37, is screwed onto shaft 33. Attached to the cylinder 10 is a bar member 39, which bar fits into a slot in the arm 37 of follower 34. The arm 36, including a spring tensioned lever member pivoted to a rigid member from follower 34, provides controlled rotational movement for the follower 34 in its axial movement in the same manner that the follower 13 attached to core member 14 provides limited rotational movement of core member 14. The arm 36 rides on a cam 35 to provide controlled rotational movement of follower 34. Cam 35 is constructed similarly to the cam 24 so that a desired contour may be placed on the cam surface as described in the above referenced patent. Now, as the oscillator is tuned by knob 11, the follower 34 proceeds down shaft 33. As the follower is directed by the cam 35, it imparts slight rotational movement to the cylinder 10, but at all times provides for a limited rotational movement of the cylinder 10. It is obvious that as the cylinder 10 is rotated, a slight rotational movement is then transmitted to the core member 14. This rotation is the resultant of the rotational movement about the shaft 16 of the cam 24. This invention thus provides an adjustment of cam 24 to control the rotation of core 14 with respect to coil 12 without actually touching the cam 24.

Thus, minor changes in output frequency can be made by changing the action of the cam 35 to control the rotation of cylinder 10. A completely linear output frequency characteristic for the oscillator is then obtainable at all times, even with a hermetically sealed oscillator.

Figure 2:
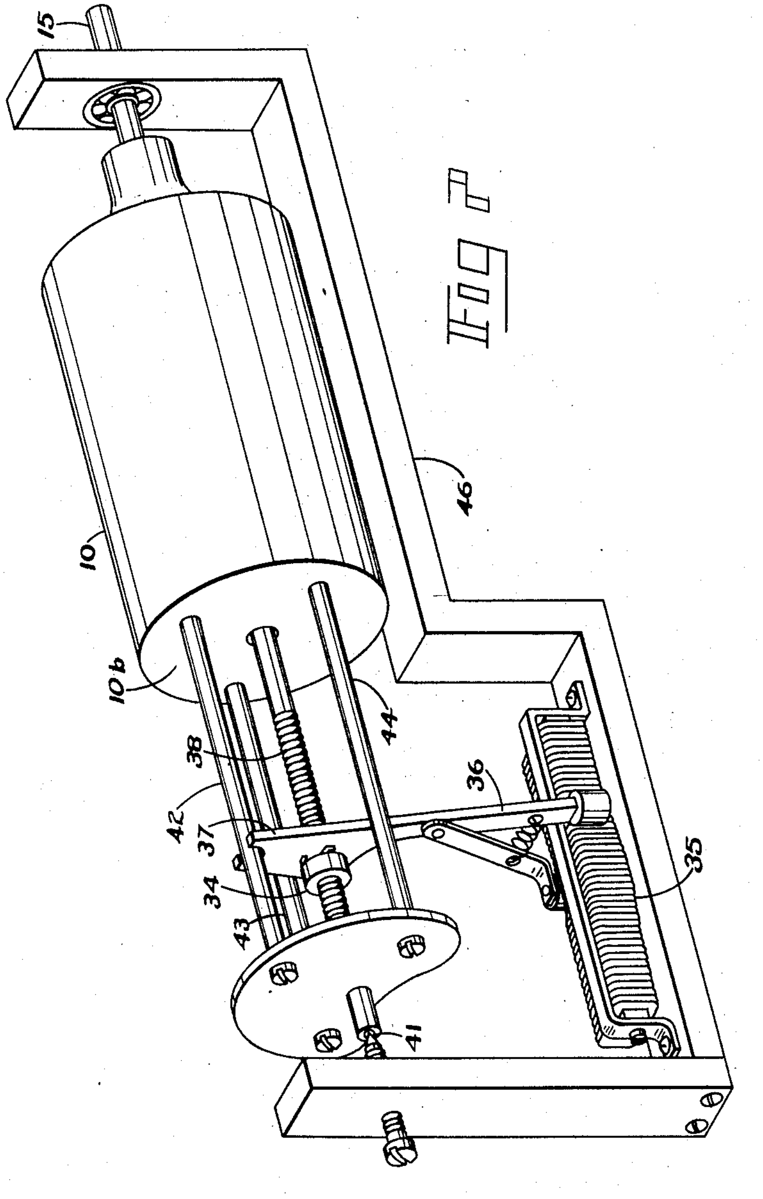
Figure 2 is a pictorial representation of another embodiment of this invention.

Figure 2 depicts another embodiment of this invention where the same permeability tuned oscillator described above is used and contained within cylinder 10. Similar elements to Figure 1 bear the same reference numerals. The shaft 15 protrudes through the end 10*b* of the cylinder. Firmly affixed to the end 10*b* are three rods 42, 43, and 44. Shaft 15 has a second threaded portion 16 exterior to one end of cylinder 10. This threaded portion 16 also is cut so as to axially move a follower at a predetermined faster rate than the rate of movement of the core member 14. The shaft 15 is supported by the support means 41, rotatably holding one end of shaft 15. The entire shaft is supported by the framework 46. A cam mechanism 35 is provided. Follower means 34, having two arms 36 and 37, is also provided. This follower proceeds down the second threaded portion of shaft 15 at a predetermined rate and provides rotational movement to the cylinder 10 through the operation of arm 37 and rod 42. This rotational movement is controlled by the contour of the variable surface of the cam 36. The rotational movement of cylinder 10 produces a slight rotational movement of the cam 24 and minor variations in the output frequency of the oscillator result as described above.

This invention provides a control means so a permeability tuned oscillator produces linear output frequency characteristics at all times. This control means is especially advantageous with oscillators which are sealed to increase their permanent stability characteristics.

Although this invention has been described with respect to particular embodiments thereof, it is not to be so limited as changes and modifications may be made therein which are within the full intended scope of the invention as defined by the appended claims.

What is claimed is:

1. A tuning mechanism for an oscillator comprising an inductance element, a sealed container, a rotatable threaded shaft extending through said container, said inductance element including a coil member rigidly mounted to the inside of said container and a core member threadedly mounted to said shaft within said container, said core member being moved axially to change its relationship with said coil member in response to relative rotation between said core member and said shaft, cam means fixed to the inside wall of said container, follower means fixed to said core member and engaging said cam means, means for pivoting said container for rotation about the axis of said shaft, said follower means cooperating with said cam means in response to rotation of said shaft to rotate said core member slightly relative to said container during axial motion of said core member thereby to vary within predetermined limits the rate of axial motion of said core member relative to the rotation of said shaft simultaneously with the axial motion of said core member, means external to said container responsive to the rotation of said shaft for rotating said container slightly simultaneously with axial motion of said core member, said last means thereby varying further the rate of axial motion of said core member relative to the rate of rotation of said shaft.

2. A tuning mechanism for an oscillator comprising an inductance element, a sealed container, a rotatable threaded shaft extending through said container, said inductance element including a coil member rigidly mounted to the inside of said container and a core member threadedly mounted to said shaft within said container, said core member being moved axially to change its relationship with said coil member in response to relative rotation between said core member and said shaft, first cam means fixed to the inside wall of said container, first follower means fixed to said core member and engaging said first cam means, means for pivoting said container for rotation about the axis of said shaft, said follower means cooperating with said cam means in response to rotation of said shaft to rotate said core member slightly relative to said container during axial motion of said core member thereby to vary within predetermined limits the rate of axial motion of said core member relative to the rotation of said shaft simultaneously with the axial motion of said core member, a second cam means and a second follower means external to said container, said second follower means being joined to said container and being in engagement with said second cam means for accurately determining orientation of said container about the axis of said shaft, said second follower means in cooperation with said second cam means being operated in response to rotation of said shaft to rotate said container about said shaft so that the rate of axial motion of said core member varies relative to the rate of rotation of said shaft as determined by cooperation of said first and second follower means.

3. A tuning mechanism for an oscillator comprising an inductance element, a sealed container, a rotatable first threaded shaft extending through said container, said inductance element including a coil member rigidly mounted to the inside of said container and a core member threadedly mounted to said first shaft within said container, said core member being moved axially to change its relationship with said coil member in response to relative rotation between said core member and said first shaft, first cam means fixed to the inside wall of said container, first follower means fixed to said core member and engaging said first cam means, means for pivoting said container for rotation about the axis of said first shaft, said first follower means cooperating with said first cam means in response to rotation of said first shaft to rotate said core member slightly relative to said container during axial motion of said core member thereby to vary within predetermined limits the rate of axial motion of said core member relative to the rotation of said first shaft simultaneously with the axial motion of said core member, a second threaded shaft rotatably mounted external to said container, gear means for coupling said second threaded shaft to said first shaft, a second cam means, a second follower means threadedly mounted to said second shaft, said second follower means being joined to said container and being in engagement with said second cam means for accurately determining orientation of said container about the axis of said first shaft, said second shaft being rotated in response to rotation of said first shaft for producing axial motion of said second follower means at a predetermined faster rate than the axial motion of said first follower means, said second follower means in response to rotation of said second shaft operating in cooperation with said second cam means to rotate slightly said container about said first shaft so that the rate of axial motion of said core member varies relative to the rate of rotation of said first shaft as determined by cooperation of said first and second follower means.

4. A tuning mechanism for an oscillator comprising an inductance element, a sealed container, a rotatable threaded shaft extending through said container, said inductance element including a coil member rigidly mounted to the inside of said container and a core member threadedly mounted to said shaft within said container, said core member being moved axially to change its relationship with said coil member in response to relative rotation between said core member and said shaft, first cam means fixed to the inside wall of said container, first follower means fixed to said core member and engaging said first cam means, means for pivoting said container for rotation about the axis of said shaft, said first follower means cooperating with said first cam means in response to rotation of said shaft to rotate said core member slightly relative to said container during axial motion of said core member thereby to vary within predetermined limits the rate of axial motion of said core member relative to the rotation of said shaft simultaneously with the axial motion of said core member, a second follower means external to said container threadedly mounted to said shaft, a second cam means, said second follower means being coupled to said container and being in engagement with said second cam means, said second follower means being moved axially in response to rotation of said shaft to cooperate with said second cam means for providing slight rotation of said container about said shaft so that the rate of axial motion of said core member varies relative to the rate of rotation of said shaft as determined by cooperation of said first and second follower means.

References Cited in the file of this patent

UNITED STATES PATENTS 2,468,071 Hunter ---------------- Apr. 26, 1949